(12) United States Patent
Chen et al.

(10) Patent No.: US 8,772,137 B2
(45) Date of Patent: Jul. 8, 2014

(54) SEMICONDUCTOR WAFER WITH ASSISTING DICING STRUCTURE AND DICING METHOD THEREOF

(71) Applicant: Taiwan Semiconductor Manufacturing Co., Ltd., Hsin-Chu (TW)

(72) Inventors: Hsien-Wei Chen, Sinying (TW); Shih-Hsun Hsu, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/132,192

(22) Filed: Dec. 18, 2013

(65) Prior Publication Data

US 2014/0106544 A1  Apr. 17, 2014

Related U.S. Application Data

(62) Division of application No. 11/745,595, filed on May 8, 2007, now Pat. No. 8,629,532.

(51) Int. Cl.
*H01L 21/301* (2006.01)
*H01L 21/46* (2006.01)

(52) U.S. Cl.
USPC ............ 438/462; 438/460; 438/33; 438/113; 257/E21.599

(58) Field of Classification Search
USPC ............ 438/462, 460, 33, 113; 257/E21.599
See application file for complete search history.

(56) References Cited

U.S. PATENT DOCUMENTS

| 5,024,970 | A | | 6/1991 | Mori |
| 5,925,924 | A | | 7/1999 | Cronin et al. |
| 5,943,591 | A | * | 8/1999 | Vokoun et al. ............... 438/462 |
| 6,075,280 | A | | 6/2000 | Yung et al. |
| 6,084,287 | A | * | 7/2000 | Mitwalsky et al. ........... 257/620 |
| 6,383,893 | B1 | * | 5/2002 | Begle et al. .................... 438/460 |
| 6,573,156 | B1 | | 6/2003 | Wang et al. |
| 6,821,867 | B2 | | 11/2004 | Matsuura et al. |
| 2002/0016047 | A1 | | 2/2002 | Tateishi |
| 2005/0101108 | A1 | | 5/2005 | Genda et al. |
| 2005/0269702 | A1 | * | 12/2005 | Otsuka ........................ 257/750 |
| 2006/0189099 | A1 | | 8/2006 | Lu et al. |
| 2006/0223234 | A1 | | 10/2006 | Terayama et al. |
| 2007/0111477 | A1 | * | 5/2007 | Maruyama et al. ........... 438/460 |
| 2007/0269931 | A1 | * | 11/2007 | Chung et al. .................. 438/109 |
| 2008/0048299 | A1 | | 2/2008 | Hedler et al. |
| 2008/0136026 | A1 | | 6/2008 | Yang |

FOREIGN PATENT DOCUMENTS

JP         07162057        6/1995

* cited by examiner

*Primary Examiner* — Nitin Parekh
(74) *Attorney, Agent, or Firm* — McClure, Qualey & Rodack, LLP

(57) ABSTRACT

A semiconductor wafer with an assisting dicing structure. The wafer comprises a substrate having a front surface and a rear surface. The front surface of the substrate comprises at least two device regions separated by at least one dicing lane. The rear surface of the substrate comprises at least one pre-dicing trench formed therein and substantially aligned with the dicing lane. A method for dicing a semiconductor wafer is also disclosed.

12 Claims, 5 Drawing Sheets

US 8,772,137 B2

SEMICONDUCTOR WAFER WITH ASSISTING DICING STRUCTURE AND DICING METHOD THEREOF

CROSS REFERENCE TO RELATED APPLICATIONS

This application is a Divisional of U.S. patent application Ser. No. 11/745,595, filed May 8, 2007 and entitled "Semiconductor Wafer with Assisting Dicing Structure and Dicing Method Thereof", the entirety of which is incorporated by reference herein.

BACKGROUND OF THE INVENTION

1. Field of the Invention

The invention relates to semiconductor technology and in particular to a semiconductor wafer with an assisting dicing structure and a dicing method thereof capable of preventing cracks from forming or propagating in the integrated circuits of the wafer during dicing.

2. Description of the Related Art

In the manufacture of microelectronic devices, a plurality of integrated circuits are formed on a semiconductor wafer, usually comprised primarily of silicon, by conventional semiconductor fabrication techniques, such as photolithography, film deposition and etching, and material doping. Thus, a semiconductor wafer can comprise a plurality of integrated circuits formed on a surface area of the wafer and arranged in rows and columns with the periphery of each integrated circuit being rectangular.

Typically, individual integrated circuits are formed by sawing or dicing through the wafer into rectangular discrete chips or diced along two mutually perpendicular sets of parallel lines or lanes referred to as dicing lines or lanes. Generally, elements or devices of the integrated circuit are not formed in the dicing lane regions, but dummy patterns for chemical mechanical polishing (CMP), test elements for testing the function elements, alignment marks for mask alignment or may be formed therein.

The sawing process is employed with a dicing blade coupled to a rotating spindle connected to a motor. The rotating spindle rotates at a high speed to cut the wafer into individual chips. However, stress may be created in the dicing lane regions during the sawing process. The created stress is a source of crack propagating into integrated circuit regions causing fatal defects. The cracking may be aggravated as the device material properties become weaker to meet various electrical property requirements.

Thus, there exists a need for an improved dicing method for a semiconductor wafer to reduce formation or propagation of cracks therein.

BRIEF SUMMARY OF INVENTION

A detailed description is given in the following embodiments with reference to the accompanying drawings. A semiconductor wafer with an assistant dicing structure and a dicing method thereof are provided, respectively. An embodiment of a semiconductor wafer with an assisting dicing structure comprises a substrate having a front surface and a rear surface. The front surface of the substrate comprises at least two device regions separated by at least one dicing lane. The rear surface of the substrate comprises at least one pre-dicing trench formed therein and substantially aligned with the dicing lane.

An embodiment of a method for dicing a semiconductor wafer comprises providing a semiconductor wafer having a front surface and a rear surface, wherein the front surface of the semiconductor wafer comprises at least two device regions separated by at least one dicing lane. At least one pre-dicing trench in the rear surface of the semiconductor wafer is formed, wherein the pre-dicing trench is substantially aligned with the dicing lane. The semiconductor wafer is sawed through from the dicing lane of the front surface to the rear surface or from the rear surface substantially aligned with the dicing lane to the front surface, such that the sawing cuts through the pre-dicing trench.

BRIEF DESCRIPTION OF DRAWINGS

The invention can be more fully understood by reading the subsequent detailed description and examples with references made to the accompanying drawings, wherein:

FIG. 2B-1 is a cross section of an embodiment of a method for dicing a semiconductor wafer shown in FIG. 2A;

FIG. 2B-2 is a cross section of an embodiment of a method for dicing a semiconductor wafer shown in FIG. 2A;

FIG. 6B-1 is a cross section of an embodiment of a method for dicing a semiconductor wafer shown in FIG. 6A; and FIG. 6B-2 is a cross section of an embodiment of a method for dicing a semiconductor wafer shown in FIG. 6A.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. Embodiments of a semiconductor wafer with an assistant dicing structure and a dicing method thereof are described with reference to the accompanying drawings.

Figure 1:
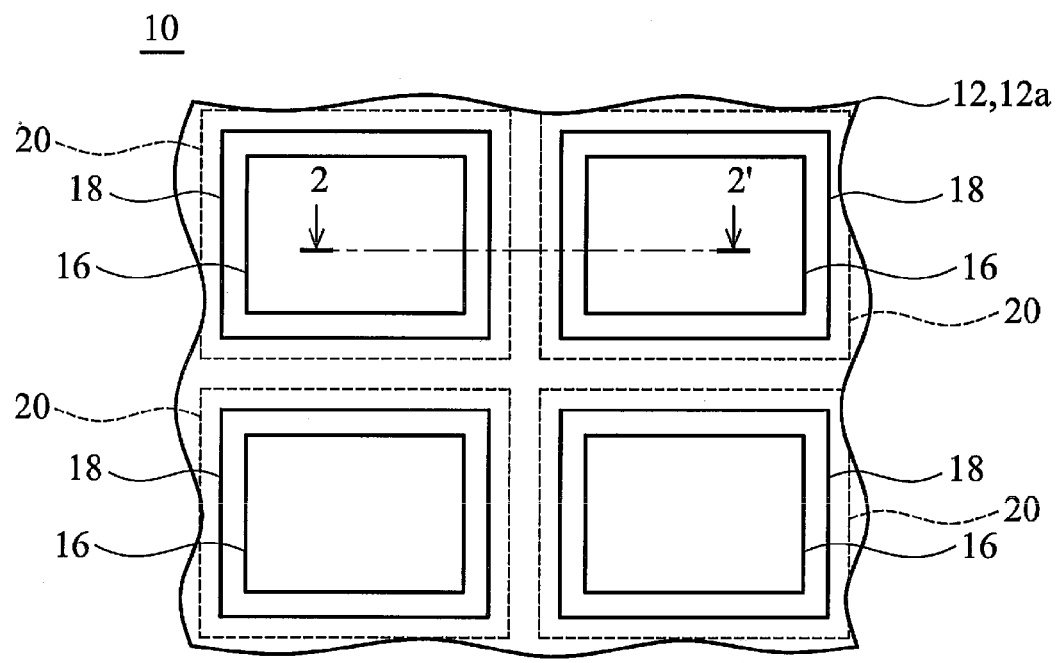
FIG. 1 is a plan view of an embodiment of a semiconductor wafer with an assisting dicing structure.
Figure 2A:
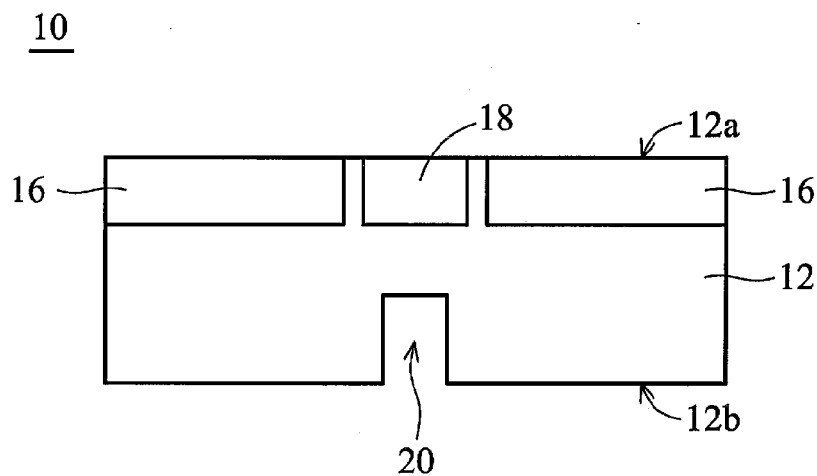
FIG. 2A is a cross section along line 2-2' shown in FIG. 1.

FIGS. 1 and 2A illustrate an embodiment of a semiconductor wafer with an assisting dicing structure, in which FIG. 1 is a plan view and FIG. 2A is a cross section along line 2-2' shown in FIG. 1. The semiconductor wafer 10 comprises a substrate 12. The substrate 12 may comprise silicon, germanium, silicon germanium, GaAs, InAs, InP and other Group III-V semiconductor compounds. The substrate 12 may also comprise layered semiconductor such as Si/SiGe. Compound semiconductors such as GaAs and InP possess excellent properties such as high electron mobility being suitable for high frequency and high-speed devices. The devices employing Group III-V compounds can operate at high voltage, power, and switching frequencies.

Figure 3:
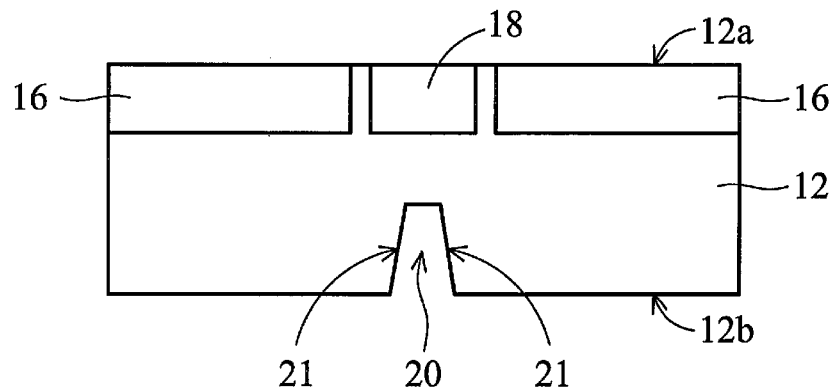
FIG. 3 is a cross section of an embodiment of a semiconductor wafer with an assisting dicing structure.

The substrate 12 has a front surface 12a referred to as an active surface and a rear surface 12b opposing the front surface 12a. The front surface 12a of the substrate 12 comprises a plurality of device regions or integrated circuit regions 16 arranged in an array. These device regions 16 are separated by two mutually perpendicular sets of parallel dicing lanes 18. In this embodiment, a pre-dicing trench 20 is formed in the rear surface 12b of the substrate 12 and substantially aligned with the dicing lane 18 to serve as an assisting dicing structure. Moreover, the pre-dicing trench 20 extends along an extending direction of each dicing lane 18. In this embodiment, the pre-dicing trench 20 has substantially vertical sidewalls. In some embodiments, the pre-dicing trench 20 has tapered sidewalls 21, as shown in FIG. 3.

Figures 1, 2B:
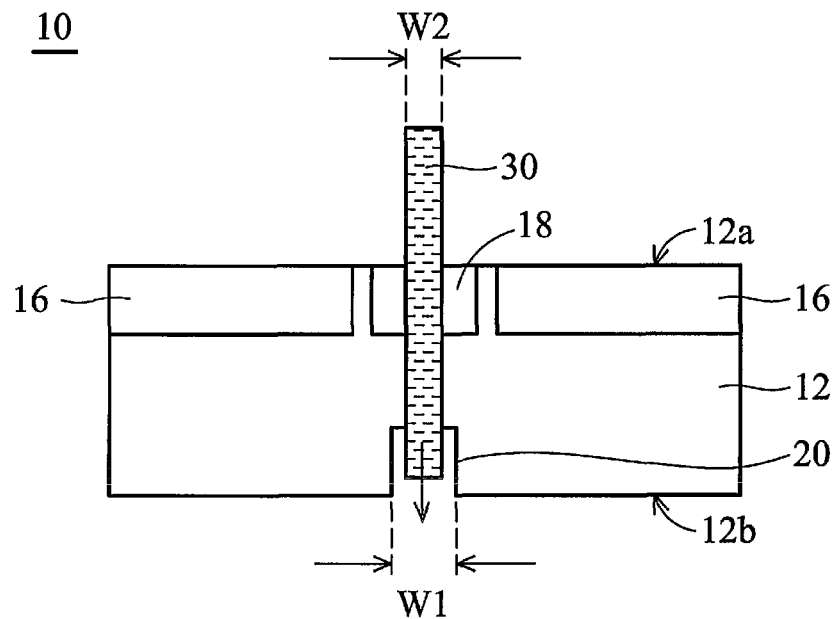

FIG. 2B-1 is a cross section of an embodiment of a method for dicing a semiconductor wafer shown in FIG. 2A. A semiconductor wafer 10 is provided. The wafer 10 is comprised of a substrate 12, such as a silicon substrate, having a front surface 12a referred to as an active surface and a rear surface 12b opposing the front surface 12a. The front surface 12a of the substrate 12 comprises a plurality of device regions 16 arranged in an array and separated by two mutually perpendicular sets of parallel dicing lanes 18. Next, a pre-dicing trench 20 is formed in the rear surface 12b of the substrate 12, substantially aligned with the dicing lane 18. In this embodiment, the pre-dicing trench 20 may be formed by any method known to those skilled in the art. For example, the pre-dicing trench 20 may be formed by sawing, etching, laser ablating, or ion milling. Moreover, the pre-dicing trench 20 has a width W1 and extends along an extending direction of each dicing lane 18. Thereafter, the semiconductor wafer 10 is sawed through from each dicing lane 18 of the front surface 12a to the rear surface 12b by a dicing blade 30, as the arrow indicates in FIG. 2B-1, thereby cutting through the semiconductor wafer 10 into individual integrated circuits or chips. In this embodiment, the dicing blade 30 has a width W2 narrower than the width W1 of the pre-dicing trench W1. Since stress may be created at the pre-dicing trench 20 during sawing of the semiconductor wafer 10, the stress created at the dicing lanes 18 can be relatively reduced. Thus, cracks from forming or propagating in the device regions 16 of the semiconductor wafer 10 during dicing can be mitigated or eliminated.

Figures 2, 2B:
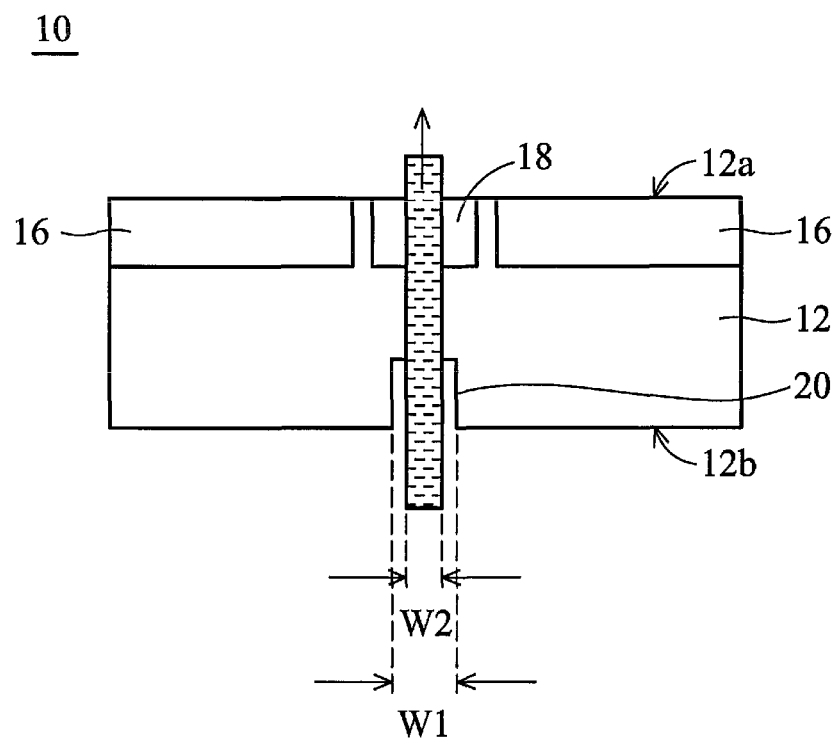

In some embodiments, referring to FIG. 2B-2, the semiconductor wafer 10 is sawed through from the rear surface 12b substantially aligned with each dicing lane 18 to the front surface 12a by a dicing blade 30, as the arrow indicated in FIG. 2B-2, thereby cutting through the semiconductor wafer 10 into individual integrate circuits or chips.

Figure 4:
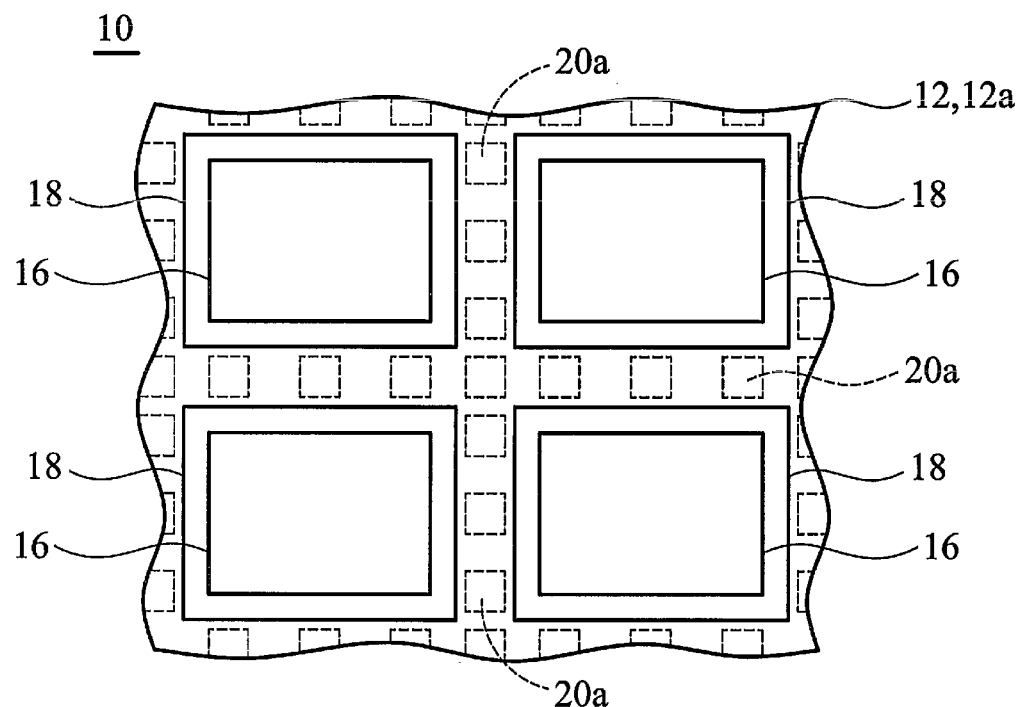
FIG. 4 is a plan view of an embodiment of a semiconductor wafer with an assisting dicing structure.
Figure 5:
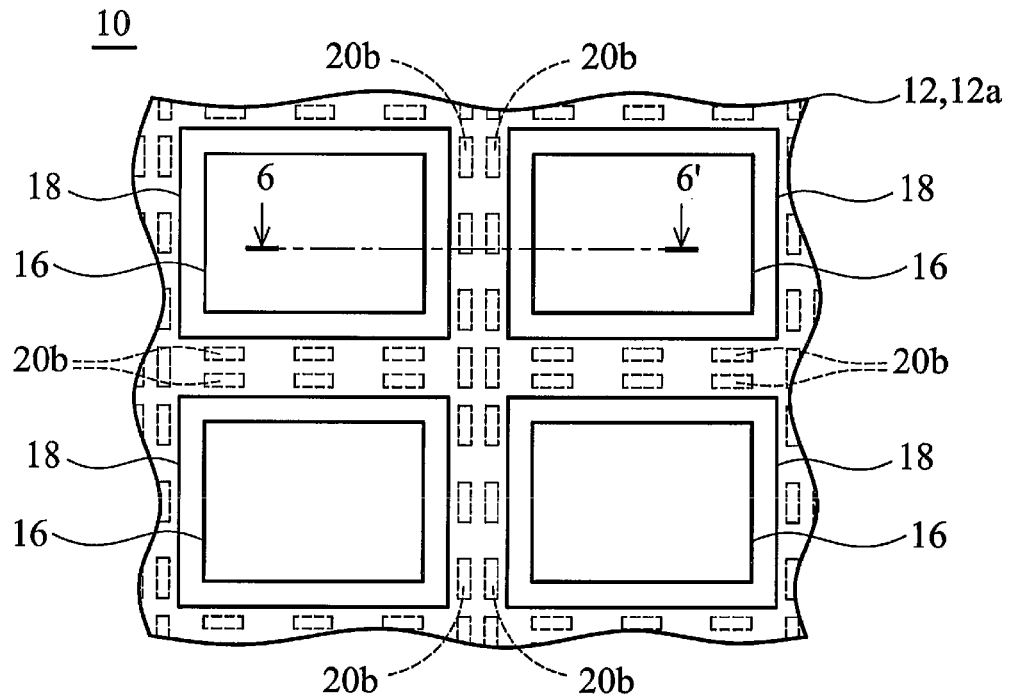
FIG. 5 is a plan view of an embodiment of a semiconductor wafer with an assisting dicing structure.

FIGS. 4 and 5 illustrate various embodiments of a semiconductor wafer with an assisting dicing structure. Elements in FIGS. 4 and 5 the same as those in FIG. 1 bear the same reference numbers and are not described in detail again. In FIG. 4, the rear surface 12b of the substrate 12 comprises a plurality of pre-dicing trenches 20a formed therein and substantially aligned with each dicing lane 18. Moreover, the plurality of pre-dicing trenches 20a is arranged in a line extending along the extending direction of each dicing lane 18. In this embodiment, each pre-dicing trench 20a is square and may have a width the same as the width W1 of the pre-dicing trench 20. Additionally, each pre-dicing trench 20a may be wider than width W2 of the dicing blade 30. In some embodiments, each pre-dicing trench 20a may be rectangular or circular. Also, the rectangular or circular pre-dicing trench 20a has a width or diameter wider than the width W2 of the dicing blade 30. Additionally, the dicing method for the semiconductor wafer 10 shown in FIGS. 2B-1 and 2B-2 also can be applied in the semiconductor wafer 10 shown in FIG. 4.

Figure 6A:
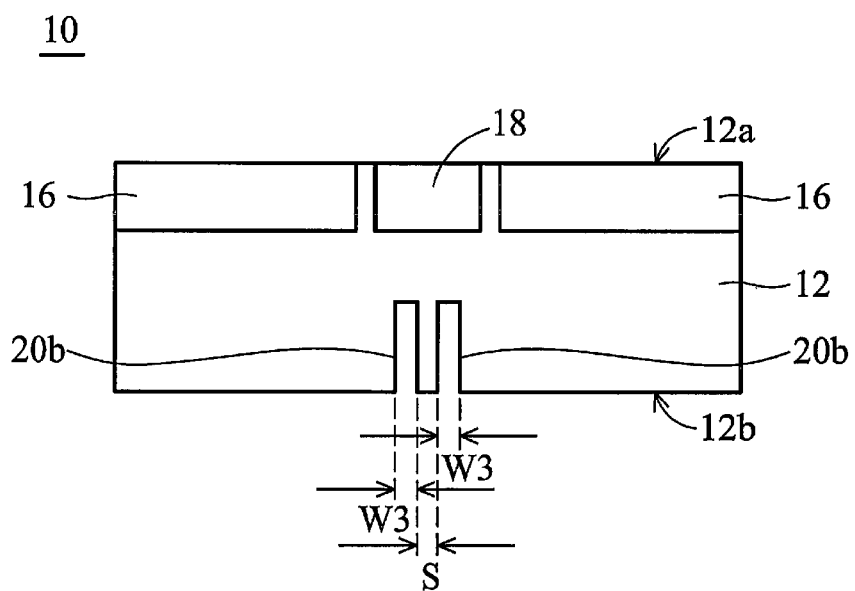
FIG. 6A is a cross section along line 6-6' shown in FIG. 5.

Referring to FIGS. 5 and 6A, in which FIG. 6A is a cross section along line 6-6' shown in FIG. 5, unlike the embodiment of FIG. 4, the rear surface 12b of the substrate 12 comprises a plurality of pairs of pre-dicing trenches 20b formed therein and substantially aligned with each dicing lane 18. Moreover, the plurality of pairs of pre-dicing trenches 20b is arranged in a line extending along the extending direction of each dicing lane 18. In this embodiment, each pair of pre-dicing trenches 20b has a space S therebetween. Moreover, each pre-dicing trench 20b is rectangular and has a width W3. The space S is narrower than the width W2 of the dicing blade 30. Moreover, the sum of the space S and the total widths of the pair of pre-dicing trench 20b (i.e. S+2W3>W2) are wider than the width W2 of the dicing blade 30. In some embodiments, each pre-dicing trench 20b may be square or circular. Also, the square or circular pre-dicing trench 20b has a width or diameter the same as the width W3.

Figures 1, 6B:
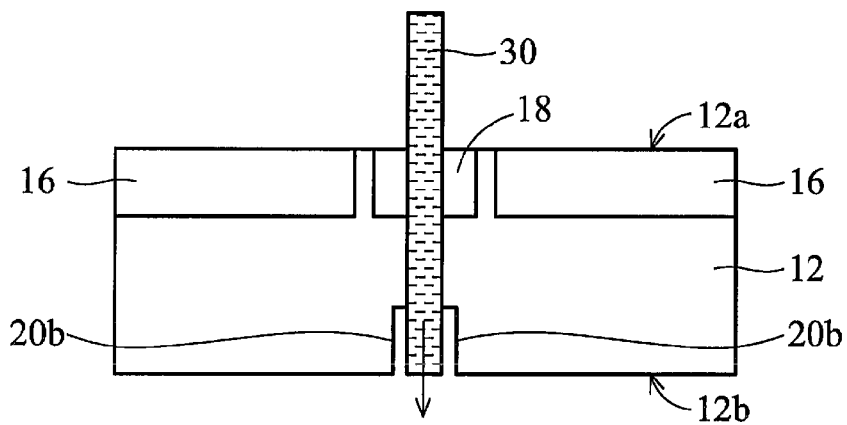
Figures 2, 6B:
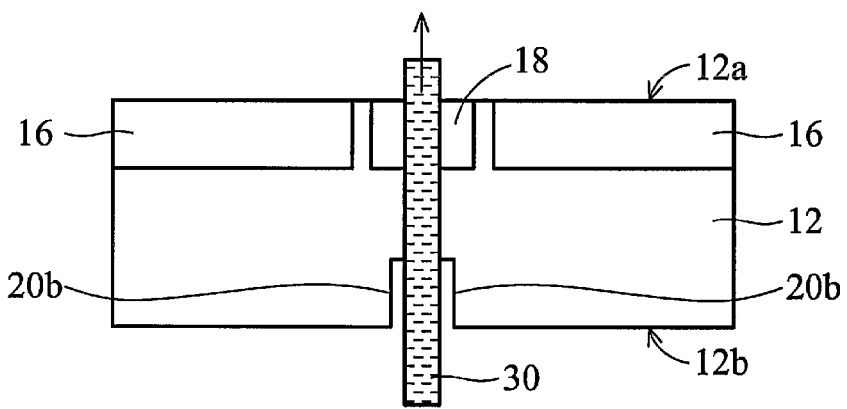

FIGS. 6B-1 and 6B-2 illustrate various embodiments of a method for dicing a semiconductor wafer shown in FIG. 6A. In FIG. 6B-1, a semiconductor wafer 10 is provided. The semiconductor wafer 10 is comprised of a substrate 12, such as a silicon substrate, having a front surface 12a referred to as an active surface and a rear surface 12b opposing the front surface 12a. The front surface 12a of the substrate 12 comprises a plurality of device regions 16 arranged in an array and separated by two mutually perpendicular sets of parallel dicing lanes 18. Next, a plurality of pairs of pre-dicing trenches 20b is formed therein and substantially aligned with each dicing lane 18, as shown in FIG. 6A. In this embodiment, the pre-dicing trench 20b may be formed by, for example, etching, laser ablating, or ion milling. Thereafter, the semiconductor wafer 10 is sawed through from each dicing lane 18 of the front surface 12a to the rear surface 12b by a dicing blade 30 with a width W2, as the arrow indicates in FIG. 6B-1, thereby cutting through the semiconductor wafer 10 into individual integrate circuits or chips. In this embodiment, the space S is narrower than the width W2 of the dicing blade 30. Moreover, the sum of the space S and the total widths of the pair of pre-dicing trenches 20b exceeds the width W2 of the dicing blade 30. Since stress created at the dicing lanes 18 can be relatively reduced by formation of the plurality of pairs of pre-dicing trenches 20b, cracks from forming or propagating in the device regions 16 of the semiconductor wafer 10 during dicing can be mitigated or eliminated.

In some embodiments, referring to FIG. 6B-2, the semiconductor wafer 10 is sawed through from the rear surface 12b substantially aligned with each dicing lane 18 to the front surface 12a by a dicing blade 30, as the arrow indicated in FIG. 6B-2, thereby cutting through the semiconductor wafer 10 into individual integrated circuits or chips.

According to the invention, since stress created in the dicing lanes during dicing can be shared by the assisting dicing structure (i.e. the pre-dicing trench) formed on the rear surface of the semiconductor wafer, cracks from forming or propagating in the device regions of the semiconductor wafer during dicing can be mitigated or eliminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for dicing a semiconductor wafer, comprising:
providing a semiconductor wafer having a front surface and a rear surface, wherein the front surface of the semiconductor wafer comprises at least two device regions separated by at least one dicing lane;
forming a plurality of pre-dicing trenches in the rear surface of the semiconductor wafer and without passing therethrough and substantially aligned with the dicing lane, wherein the plurality of pre-dicing trenches are arranged in a line extending along an extending direction of the dicing lane and each pre-dicing trench has a width less than that of the dicing lane; and sawing through the semiconductor wafer, such that the sawing cuts partially through the plurality of pre-dicing trenches.

2. The method as claimed in claim 1, wherein each pre-dicing trench has a width wider than a width of a dicing blade for sawing the semiconductor wafer.

3. The method as claimed in claim 1, wherein a plurality of pairs of pre-dicing trenches is formed in the rear surface of the substrate, arranged in a line extending along the extending direction of the dicing lane.

4. The method as claimed in claim 3, wherein each pair of pre-dicing trenches has a space therebetween and the space is narrower than a width of a dicing blade for sawing the semiconductor wafer.

5. The method as claimed in claim 4, wherein each pre-dicing trench of the pair of the pre-dicing trenches has a width, and the sum of the space and the total width of the pair of the dicing trenches exceeds a width of a dicing blade for sawing the semiconductor wafer.

6. The method as claimed in claim 3, wherein each pair of pre-dicing trenches is rectangular in a plan view.

7. The method as claimed in claim 6, wherein each pair of pre-dicing trenches has a length edge parallel to the extending direction of the dicing lane.

8. The method as claimed in claim 1, wherein the sidewalls of the plurality of pre-dicing trench are tapered.

9. The method as claimed in claim 1, wherein the plurality of pre-dicing trenches is formed by sawing, etching, laser ablating, or ion milling.

10. The method as claimed in claim 1, wherein each pre-dicing trench is square or circular.

11. The method as claimed in claim 1, wherein the semiconductor wafer is sawed from the dicing lane of the front surface to the rear surface.

12. The method as claimed in claim 1, wherein the semiconductor wafer is sawed from the rear surface substantially aligned with the dicing lane to the front surface.

* * * * *